US012787688B2

(12) United States Patent
Watanabe et al.

(10) Patent No.: US 12,787,688 B2
(45) Date of Patent: Nov. 3, 2026

(54) SUBSTRATE PROCESSING APPARATUS AND TEMPERATURE REGULATION METHOD

(71) Applicant: Tokyo Electron Limited, Tokyo (JP)

(72) Inventors: Tatsuya Watanabe, Yamanashi (JP); Yuichi Takenaga, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 577 days.

(21) Appl. No.: 18/217,918

(22) Filed: Jul. 3, 2023

(65) Prior Publication Data

US 2024/0014054 A1 Jan. 11, 2024

(30) Foreign Application Priority Data

Jul. 6, 2022 (JP) ................................ 2022-109288

(51) Int. Cl.
*C23C 16/46* (2006.01)
*H10P 72/00* (2026.01)

(52) U.S. Cl.
CPC .......... *H10P 72/0602* (2026.01); *C23C 16/46* (2013.01)

(58) Field of Classification Search
CPC ... C23C 16/46; C23C 16/52; H01L 21/67098; H01L 21/67248; H10P 72/0602; H10P 72/0604
USPC .......................................... 118/724, 725, 708
See application file for complete search history.

(56) References Cited

U.S. PATENT DOCUMENTS

2002/0085212 A1* 7/2002 Campbell ........... H10P 72/0604 356/600
2017/0278699 A1* 9/2017 Kasai ................ C23C 16/45525

FOREIGN PATENT DOCUMENTS

JP 2003-059837 A 2/2003
JP 2020-047911 A 3/2020

* cited by examiner

*Primary Examiner* — Rodney G Mcdonald
(74) *Attorney, Agent, or Firm* — Venjuris, P.C.

(57) ABSTRACT

A substrate processing apparatus includes: a processing container, a temperature adjustment furnace, and a controller. The temperature controller includes at least one of a ceiling heater heating the processing container from a ceiling and a lower heater heating a portion below the processing container. The controller calculates a temperature condition for each of the plurality of zones to uniformize a film thickness among the plurality of substrates during the substrate processing, by using a retained upper-portion temperature model and/or lower-portion temperature model, acquires the film thickness of the plurality of substrates when the substrate processing is performed under the calculated temperature condition, and compares the acquired film thickness with a target film thickness, and when the acquired film thickness falls outside an allowable range of the target film thickness, sets a process region to be applied to the substrate processing on the plurality of substrates, based on the comparison.

11 Claims, 8 Drawing Sheets

FIG. 5A

EVALUATION FUNCTION J=F(RESIDUAL FROM TARGET FILM THICKNESS, MODEL, FINE-TUNING COEFFICIENT, ADJUSTMENT KNOB CHANGE AMOUNT)

FIG. 5B

| | | UPPER-PORTION RATIO (0.1 TIMES INCREASE) |
|---|---|---|
| FILM THICKNESS CHANGE AMOUNT [nm] | Ws1 | 5.00 |
| | Ws2 | −3.00 |
| | Ws3 | 0.50 |
| | Ws4 | −0.05 |
| | Ws5 | 0.01 |

FIG. 5C

| | | LOWER-PORTION RATIO (1°C INCREASE) |
|---|---|---|
| FILM THICKNESS CHANGE AMOUNT [nm] | Ws1 | 0.01 |
| | Ws2 | −0.08 |
| | Ws3 | 0.30 |
| | Ws4 | −1.00 |
| | Ws5 | 3.00 |

FIG. 8

| | | CEILING PLATE RATIO (0.1 TIMES INCREASE) | TVS1 TEMPERATURE (1°C INCREASE) | | | | | TVS2 TEMPERATURE (1°C INCREASE) | | | | | TVS3 TEMPERATURE (1°C INCREASE) | | | | | LOWER-PORTION TEMPERATURE (1°C INCREASE) |
|---|---|---|---|---|---|---|---|---|---|---|---|---|---|---|---|---|---|---|
| | | | TOP | C-T | CNT | B-T | BTM | TOP | C-T | CNT | B-T | BTM | TOP | C-T | CNT | B-T | BTM | |
| FILM THICKNESS CHANGE AMOUNT [nm] | Slot1 | 5.00 | 0.06 | −0.05 | 0.02 | −0.01 | 0.00 | 0.60 | −0.48 | 0.24 | −0.06 | 0.01 | 1.00 | −0.80 | 0.40 | −0.10 | 0.02 | 0.01 |
| | Slot2 | −3.00 | −0.05 | 0.06 | −0.05 | 0.02 | −0.01 | −0.48 | 0.60 | −0.48 | 0.24 | −0.06 | −0.80 | 1.00 | −0.80 | 0.40 | −0.10 | −0.08 |
| | Slot3 | 0.50 | 0.02 | −0.05 | 0.06 | −0.05 | 0.02 | 0.24 | −0.48 | 0.60 | −0.48 | 0.24 | 0.40 | −0.80 | 1.00 | −0.80 | 0.40 | 0.30 |
| | Slot4 | −0.05 | −0.01 | 0.02 | −0.05 | 0.06 | −0.05 | −0.06 | 0.24 | −0.48 | 0.60 | −0.48 | −0.10 | 0.40 | −0.80 | 1.00 | −0.80 | −1.00 |
| | Slot5 | 0.01 | 0.00 | −0.01 | 0.02 | −0.05 | 0.06 | 0.01 | −0.06 | 0.24 | −0.48 | 0.60 | 0.02 | −0.10 | 0.40 | −0.80 | 1.00 | 3.00 |

SUBSTRATE PROCESSING APPARATUS AND TEMPERATURE REGULATION METHOD

CROSS-REFERENCE TO RELATED APPLICATIONS

This application is based on and claims priority from Japanese Patent Application No. 2022-109288, filed on Jul. 6, 2022, with the Japan Patent Office, the disclosure of which is incorporated herein in its entirety by reference.

TECHNICAL FIELD

The present disclosure relates to a substrate processing apparatus and a temperature regulation method.

BACKGROUND

Japanese Patent Laid-Open Publication No. 2003-059837 discloses a substrate processing apparatus, which supplies a processing gas while heating a plurality of substrates (wafers) in a processing container, thereby forming a desired film on the surface of the substrates. The substrate processing apparatus heats the plurality of substrates by a side heater disposed on the side of the processing container, and also heats the substrates by a ceiling heater installed above the processing container. Further, Japanese Patent Laid-Open Publication No. 2020-047911 discloses a substrate processing apparatus, which may also heat a manifold supporting a processing container, by a lower heater.

In these substrate processing apparatuses, the film thickness among the plurality of substrates (inter-plane uniformity) may not be uniform when the film thickness of the plurality of substrates is precisely measured.

SUMMARY

According to an aspect of the present disclosure, a substrate processing apparatus includes: a processing container that performs a substrate processing for forming a film on a plurality of substrates; a temperature controller that adjusts a temperature of the plurality of substrates accommodated in the processing container, for each of a plurality of zones set in advance; and a controller that controls an operation of the temperature controller. The temperature controller includes at least one of a ceiling heater that heats the processing container from a ceiling and a lower heater that heats a lower portion of the processing container or a portion below the processing container. The controller holds at least one of an upper-portion temperature model of a film thickness change amount based on a temperature change of the ceiling heater and a lower-portion temperature model of a film thickness change amount based on a temperature change of the lower heater, in association with the ceiling heater and the lower heater of the temperature adjustment furnace, calculates a temperature condition for each of the plurality of zones to uniformize a film thickness among the plurality of substrates during the substrate processing, by using the upper-portion temperature model and/or the lower-portion temperature model, acquires the film thickness of the plurality of substrates when the substrate processing is performed under the calculated temperature condition, and compares the acquired film thickness with a target film thickness, and when the acquired film thickness falls outside an allowable range of the target film thickness, sets a process region to be applied to the substrate processing on the plurality of substrates, based on the comparison.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 5A is a view illustrating an evaluation function used in an optimization process. FIG. 5B is a table illustrating an upper-portion temperature model of a ceiling plate ratio. FIG. 5C is a table illustrating a lower-portion temperature model of a lower-portion temperature.

FIG. 8 is a table illustrating a model of temperature conditions according to the second embodiment.

DETAILED DESCRIPTION

Figure 1:
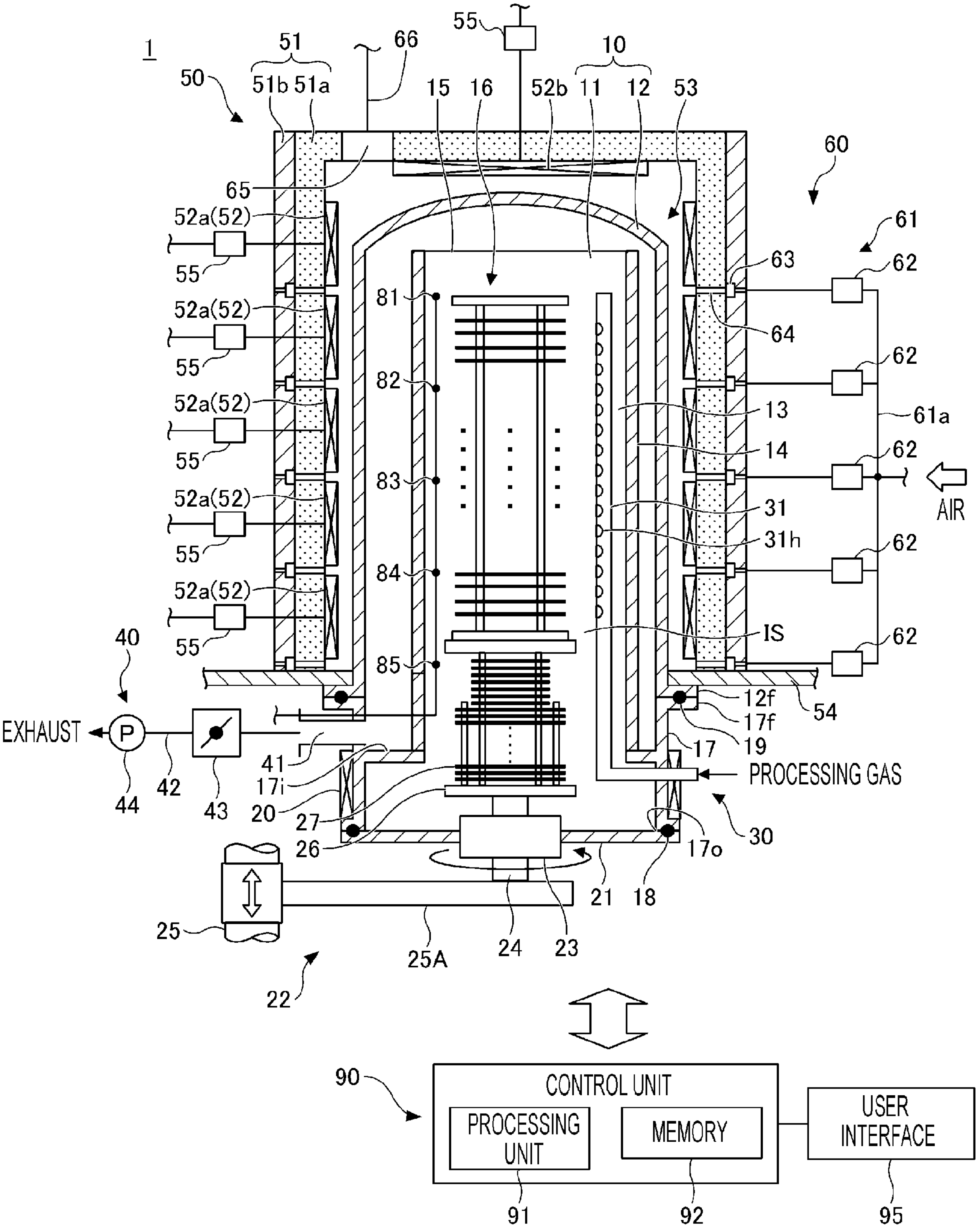
FIG. 1 is a schematic view illustrating a configuration of an entire substrate processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for implementing the present disclosure will be described with reference to the drawings. In the respective drawings, the same components will be denoted by the same reference numerals, and overlapping descriptions thereof may be omitted.

As illustrated in FIG. 1, a substrate processing apparatus 1 according to an embodiment is configured as a vertical type film forming apparatus, which arranges a plurality of substrates W along the vertical direction (the up-down direction) in a row, and performs a substrate processing for forming a predetermined film on the surfaces of the substrates W. The substrates W may be, for example, semiconductor substrates such as silicon wafers or compound semiconductor wafers, or glass substrates.

The substrate processing apparatus 1 includes a processing container 10 that accommodates the plurality of substrates W, and a temperature adjustment unit 50 disposed around the processing container 10. The substrate processing apparatus 1 further includes a control unit 90 that controls an operation of each component of the substrate processing apparatus 1.

The processing container 10 is formed in a cylindrical shape that extends vertically. Inside the processing container 10 is formed an interior space IS, in which the plurality of substrates W may be arranged along the vertical direction in a row. The processing container 10 includes, for example, a cylindrical inner cylinder 11 opened at the upper end (ceiling) and the lower end thereof, and a cylindrical outer cylinder 12 disposed outside the inner cylinder and having the ceiling while being opened at the lower end thereof. The inner cylinder 11 and the outer cylinder 12 are made of a heat resistant material such as quartz, and form a double structure by being arranged coaxially with each other. Without being limited to the double structure, the processing container 10 may have a single-cylinder structure or a multiple structure including three or more cylinders.

The inner cylinder 11 has a larger diameter than the diameter of each substrate W, and has an axial length enough to accommodate the individual substrates W (e.g., equal to or more than the arrangement height of the individual substrates W). Inside the inner cylinder 11 is formed a processing space (a portion of the interior space IS) where the substrate processing is performed by ejecting a gas to each accommodated substrate W. An opening 15 is provided at the upper end of the inner cylinder 11 to communicate with the processing space, and allow the gas to flow out into a distribution space (another portion of the interior space IS) between the inner cylinder 11 and the outer cylinder 12.

At a predetermined circumferential position of the inner cylinder 11, an accommodation portion 13 is provided along the vertical direction to accommodate a gas nozzle 31. For example, the accommodation portion 13 is provided inside a convex portion 14 formed by making a portion of the side wall of the inner cylinder 11 project radially outward. Instead of the opening 15 at the upper end of the inner cylinder 11, a vertically elongated opening (not illustrated) may be formed at a predetermined position on the circumferential wall of the inner cylinder 11 (e.g., on the opposite side to the accommodation portion 13 across the central axis).

The outer cylinder 12 has a larger diameter than the inner cylinder 11, covers the inner cylinder 11 in a non-contact manner, and forms the outer shape of the processing container 10. The distribution space between the inner cylinder 11 and the outer cylinder 12 is formed above and beside the inner cylinder 11, and distributes an upwardly moving gas vertically downward.

The lower end of the processing container 10 is supported by a cylindrical manifold 17 formed of stainless steel. For example, the manifold 17 includes a manifold-side flange **17*f* at the upper end thereof. The manifold-side flange 17*f* fixes and supports an outer cylinder-side flange 12*f* formed at the lower end of the outer cylinder 12. A seal member 19 is provided between the outer cylinder-side flange 12*f* and the manifold-side flange 17*f* to airtightly seal the outer cylinder 12 and the manifold 17**.

The manifold 17 further includes an annular support **17*i* on the upper inner wall thereof. The support 17*i* protrudes radially inward, and fixes and supports the lower end of the inner cylinder 11. A lid 21 is removably mounted at a lower-end opening 17*o* of the manifold 17**.

A lower heater 20 is provided on the lateral side of the manifold 17 to heat the inside of the manifold 17. The lower heater 20 is configured with, for example, two semi-cylindrical members, which are arranged to circumferentially cover the entire outer peripheral surface of the manifold 17 while avoiding the gas nozzle 31. While FIG. 1 illustrates a state where the lower heater 20 is in contact with the manifold 17, the lower heater 20 may be spaced apart from the manifold 17. The lower heater 20 may be, for example, a flexible heater, a rod-shaped cartridge heater embedded in each semi-cylindrical member, a jacket heater, or a ribbon heater. A temperature sensor (not illustrated) may be provided in or around the lower heater 20. The lower heater 20 is connected to a temperature adjustment driver (not illustrated), such that the heating is controlled by a power feeding under the control of the temperature adjustment driver by the control unit 90. Since the lower heater 20 operates in cooperation with a side heater **52*a* and a ceiling heater 52*b* (which will be described later) during the substrate processing, the lower heater 20 makes up a part of a heater 52 of the temperature adjustment unit 50**.

The lid 21 is configured as a portion of a substrate disposition unit 22 that disposes a wafer boat 16 holding the individual substrates W in the processing container 10. The lid 21 is formed of, for example, stainless steel and has a disk shape. In a state where the individual substrates W are disposed in the interior space IS, the lid 21 airtightly seals the lower-end opening **17*o* of the manifold 17 via a seal member 18 provided at the lower end of the manifold 17**.

A rotary shaft 24 penetrates the center of the lid 21 to rotatably support the wafer boat 16 via a magnetic fluid seal unit 23. The lower portion of the rotary shaft 24 is supported on an arm 25A of a lift mechanism 25 configured with, for example, a boat elevator. By moving the arm 25A of the lift mechanism 25 up and down, the substrate processing apparatus 1 may move the lid 21 and the wafer boat 16 up and down together, thereby inserting and removing the wafer boat 16 into/from the processing container 10.

A rotation plate 26 is provided on the upper end of the rotary shaft 24. The wafer boat 16 holding the individual substrates W is supported on the rotation plate 26 via a heat insulation unit 27. The wafer boat 16 is configured with shelves capable of holding the substrates W along the vertical direction at predetermined intervals. In a state where the wafer boat 16 holds the individual substrates W, the surfaces of the substrates W extend horizontally with respect to each other.

A gas supply unit 30 is inserted into the processing container 10 through the manifold 17. The gas supply unit 30 introduces a gas such as a processing gas, a purge gas, and a cleaning gas into the interior space IS of the inner cylinder 11. The gas supply unit 30 includes the gas nozzle 31 that introduces, for example, the processing gas, the purge gas, and the cleaning gas. While FIG. 1 illustrates only one gas nozzle 31, the gas supply unit 30 may include a plurality of gas nozzles 31. For example, the plurality of gas nozzles 31 may be provided for gas types, respectively, such as the processing gas, the purge gas, and the cleaning gas.

The gas nozzle 31 is an injector tube made of quartz, and is provided to extend vertically inside the inner cylinder 11 and be bent in an L-shape at the lower end thereof thereby penetrating the manifold 17 from inside to outside. The gas nozzle 31 is fixed to and supported by the manifold 17. The gas nozzle 31 has a plurality of gas holes **31*h* at predetermined intervals along the vertical direction, and discharges a gas in the horizontal direction through each gas hole 31*h*. The interval of vertically adjacent gas holes 31*h* is set to be the same as, for example, the interval of vertically adjacent substrates W supported on the wafer boat 16. The vertical position of each gas hole 31*h* is set to be located in the middle between vertically adjacent substrates W. As a result, each gas hole 31*h*** may smoothly distribute a gas into the gap between vertically adjacent substrates W.

The gas supply unit 30 supplies, for example, the processing gas, the purge gas, and the cleaning gas to the gas nozzle 31 inside the processing container 10, while controlling the flow rate of the gas outside the processing container 10. An appropriate processing gas may be selected according to a type of film to be formed on the substrates W. For example, when a silicon oxide film is formed, a silicon-containing gas such as dichlorosilane (DCS) gas and an oxidizing gas such as ozone ($O_3$) gas may be used as the processing gas. As for the purge gas, for example, nitrogen ($N_2$) gas and argon (Ar) gas may be used.

A gas exhaust unit 40 exhausts the gas inside the processing container 10 to the outside. The gas supplied by the gas supply unit 30 moves from the processing space of the inner cylinder 11 to the distribution space, and then, is exhausted through a gas outlet 41. The gas outlet 41 is formed in the upper portion of the manifold 17 above the support **17*i*. An exhaust path 42 of the gas exhaust unit 40 is connected to the gas outlet 41. The gas exhaust unit 40 includes a pressure regulation valve 43 and a vacuum pump 44 in this order from upstream to downstream of the exhaust path 42. The gas exhaust unit 40 sucks the gas inside the processing container 10 by the vacuum pump 44, and regulates the flow rate of the gas being exhausted by the pressure regulation valve 43, so as to regulate the pressure in the processing container 10**.

A temperature sensor 80 is provided in the interior space IS of the processing container 10 (e.g., the processing space of the inner cylinder 11) to detect the temperature inside the processing container 10. The temperature sensor 80 includes a plurality of (five in this embodiment) thermometers 81 to 85 at different vertical positions thereof. As for the plurality of thermometers 81 to 85, for example, thermocouples or resistance thermometers may be used. The thermometers 81 to 85 are provided at positions corresponding to a plurality of zones, respectively, which is set along the vertical direction of the processing container 10 as described later. The temperature sensor 80 transmits the temperature detected by each of the plurality of thermometers 81 to 85 to the control unit 90.

Meanwhile, the temperature adjustment unit 50 is formed in a cylindrical shape covering the entire processing container 10, and heats and cools the individual substrates W accommodated in the processing container 10. Specifically, the temperature adjustment unit 50 includes a cylindrical housing 51 having a ceiling, and the heater 52 provided inside the housing 51.

The housing 51 is formed larger than the processing container 10, and its central axis is located at substantially the same position as the central axis of the processing container 10. For example, the housing 51 is attached to the upper surface of a base plate 54, to which the outer cylinder-side flange **12*f* is fixed. The housing 51 is installed while being spaced apart from the outer peripheral surface of the processing container 10, so that a temperature adjustment space 53 is formed between the outer peripheral surface of the processing container 10 and the inner peripheral surface of the housing 51. The temperature adjustment space 53 is formed to be continuous beside and above the processing container 10**.

The housing 51 includes a heat insulation unit **51*a* that has a ceiling and covers the entire processing container 10, and a reinforcement unit 51*b* that reinforces the heat insulation unit 51*a* on the outer peripheral side of the heat insulation unit 51*a*. That is, the sidewall of the housing 51 has the stacked structure of the heat insulation unit 51*a* and the reinforcement unit 51*b*. The heat insulation unit 51*a* is formed mainly of, for example, silica or alumina, which suppresses a heat transfer inside the heat insulation unit 51*a*. The reinforcement unit 51*b* is formed of a metal such as stainless steel. In order to suppress a heat influence on the outside of the temperature adjustment unit 50, the outer peripheral side of the reinforcement unit 51*b*** is covered with a water-cooled jacket (not illustrated).

The heater 52 of the temperature adjustment unit 50 includes a side heater **52*a* disposed beside the processing container 10, and a ceiling heater 52*b* disposed above the processing container 10. These types of heaters 52 may adopt an appropriate configuration capable of heating the plurality of substrates W in the processing container 10. As for the side heater 52*a*, for example, an infrared heater may be used, which emits infrared rays to heat the processing container 10. In this case, the side heater 52*a* is formed in a linear shape and held in a spiral, ring, arc, shank, or meandering shape via a holding unit (not illustrated) on the inner peripheral surface of the heat insulation unit 51*a***

The side heater **52*a* is divided into a plurality of (five in this embodiment) heaters along the vertical direction of the temperature adjustment unit 50, and a temperature adjustment driver 55 is connected to each heater. The temperature adjustment driver 55 is connected to the control unit 90, and heats its connected side heater 52*a* by feeding a power regulated under the control of the control unit 90 to the heater 52*a*. Thus, the substrate processing apparatus 1 may regulate the temperature of the processing container 10 independently for each of the plurality of zones where the plurality of divided heaters 52 are provided. Hereafter, the plurality of zones set in the processing container 10** will also be referred to as "TOP," "C-T," "CTR," "C-B," and "BTM" in this order from above.

The ceiling heater **52*b* is formed in a disk shape, and for example, a plate heater or a sheet heater is applied, which may heat its entire surface. The ceiling heater 52*b* also is connected to the control unit 90 via the temperature adjustment driver 55. The control unit 90 calculates a ratio of amounts of powers fed to the side heater 52*a* and the ceiling heater 52*b* that heat the TOP zone (ceiling plate ratio), and controls the temperature adjustment driver 55 based on the ceiling plate ratio to feed a power to the ceiling heater 52*b* thereby heating the ceiling heater 52*b***.

Further, the temperature adjustment unit 50 includes an external distribution unit 60 that distributes a cooling gas (e.g., air or an inert gas) in the temperature adjustment space 53 to cool the processing container 10 during the substrate processing. Specifically, the external distribution unit 60 includes an external supply line 61 and flow rate regulators 62, which are provided outside the temperature adjustment unit 50, supply flow paths 63 provided in the reinforcement unit **51*b*, and supply holes 64 formed in the heat insulation unit 51*a*. In the external supply line 61, a temperature regulation unit (e.g., a heat exchanger or a radiator) may be provided to regulate the temperature of the air flowing into the temperature adjustment space 53**.

The external supply line 61 is connected to a blower (not illustrated), which supplies air toward the temperature adjustment unit 50. The external supply line 61 branches into a plurality of branch lines **61*a* at intermediate positions. The flow rate regulators 62 are provided in the plurality of branch lines 61*a*, respectively, and each regulate the flow rate of the air distributed through each branch line 61*a*. The plurality of flow rate regulators 62 may each independently change the flow rate of the air under the control of the control unit 90. The supply flow paths 63 are formed at a plurality of locations along the axial direction of the reinforcement unit 51***b* (the vertical direction), and each extend circumferentially in an annular shape inside the cylindrical reinforcement unit 51*b*. Each supply hole 64 is formed to penetrate the heat insulation unit 51*a* to communicate with each supply flow path 63, and ejects the air introduced into each supply flow path 63 toward each of the plurality of zones in the temperature adjustment space 53.

The external distribution unit 60 further includes an exhaust hole 65 in the ceiling of the housing 51 to discharge the air supplied into the temperature adjustment space 53. The exhaust hole 65 is connected to an external exhaust line 66 provided outside the housing 51. The external exhaust line 66 exhausts the air of the temperature adjustment space 53 toward an appropriate disposal unit. Alternatively, the external distribution unit 60 may be configured such that the external exhaust line 66 is connected to the external supply line 61 to circulate the air used in the temperature adjustment space 53.

The control unit 90 of the substrate processing apparatus 1 may be a computer including, for example, a processor 91, a memory 92, and an input/output interface (not illustrated). The processor 91 may be one of a central processing unit (CPU), a graphics processing unit (GPU), an application specific integrated circuit (ASIC), a field-programmable gate array (FPGA), and circuits including multiple discrete semiconductors, or a combination thereof. The memory 92 is an appropriate combination of a volatile memory and a non-volatile memory (e.g., a compact disk, a digital versatile disk (DVD), a hard disk, and a flash memory).

The memory 92 stores programs for operating the substrate processing apparatus 1 and recipes such as process conditions for the substrate processing. The processor 91 reads and executes the programs of the memory 92, so as to control each component of the substrate processing apparatus 1. The control unit 90 may be configured with a host computer or multiple client computers, which communicate information via a network.

A user interface 95 is connected to the control unit 90 via the input/output interface. The user interface 95 may be, for example, a touch panel (an input/output device), a monitor, a keyboard, a mouse, a speaker, or a microphone. The control unit 90 receives a recipe input by a user for the substrate processing apparatus 1 via the user interface 95, and controls each component of the substrate processing apparatus 1 based on the recipe. When information is received from each component during, for example, the substrate processing, the control unit 90 appropriately notifies the information of the substrate processing (e.g., a status and errors) via the user interface 95.

Next, descriptions will be made on an occurrence of a film thickness deviation among the plurality of substrates W during the substrate processing by the substrate processing apparatus 1 described above, with reference to FIG. 2.

Figure 2A:
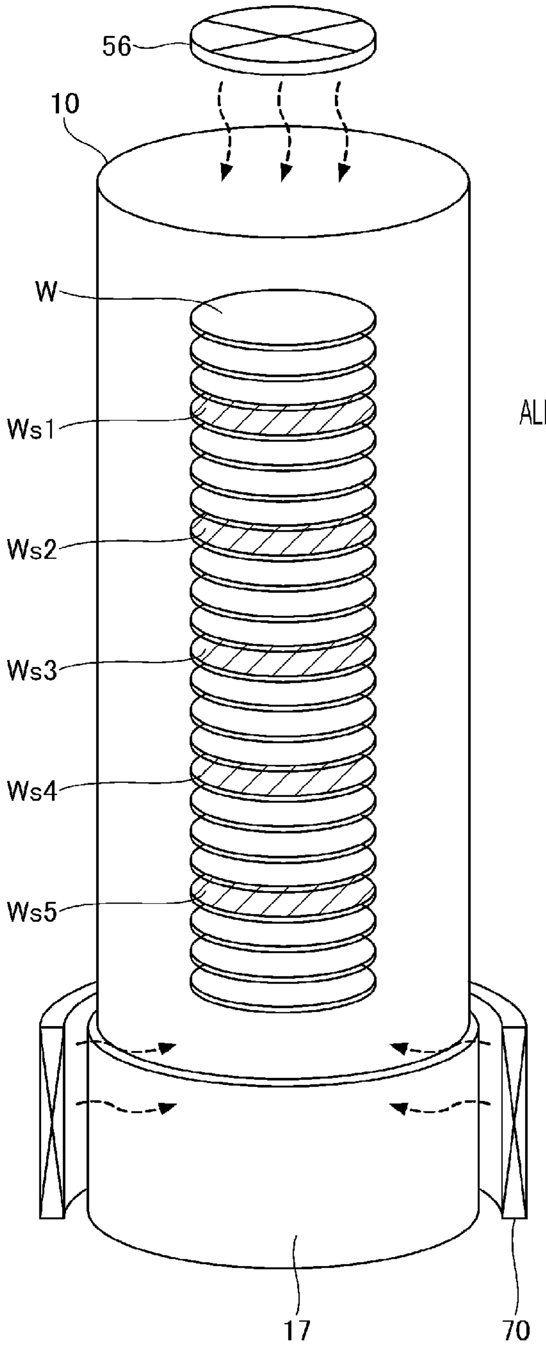
FIG. 2A is a schematic view illustrating a state where the temperature of substrates is affected by a ceiling heater and a lower heater.

As illustrated in FIG. 2A, the substrate processing apparatus 1 heats each of the side heater 52*a*, the ceiling heater 52*b*, and the lower heater 20 during the substrate processing, to regulate the temperature of each substrate W in the processing container 10. At this time, the side heater 52*a* disposed beside the processing container 10 affects the temperatures of the entire substrates W arranged vertically in a row. Since the side heater 52*a* is divided corresponding to the plurality of zones TOP, C-T, CTR, C-B, and BTM as described above, the side heater 52*a* may regulate the temperatures of the individual substrates W for each zone.

Meanwhile, the ceiling heater 52*b* affects the temperatures of the individual substrates W disposed, in particular, on the upper side among the vertically arranged substrates W. The lower heater 20 affects the temperatures of the individual substrates W disposed, in particular, on the lower side among the vertically arranged substrates W.

By regulating the temperature of each of the side heater 52*a*, the ceiling heater 52*b*, and the lower heater 20, the control unit 90 performs an inter-plane uniformity regulation to achieve the film thickness uniformity among the individual substrates W. However, for example, when the substrates W subjected to a film thickness monitoring are taken out from each of the plurality of zones to precisely measure the film thickness of each substrate W, a deviation may occur in the film thickness. Hereinafter, the substrates W subjected to the sampling will also be referred to as substrates Ws1 to Ws5 in this order from top to bottom. The substrate Ws1 is a monitoring substrate W disposed in the TOP zone. The substrate Ws2 is a monitoring substrate W disposed in the T-C zone. The substrate Ws3 is a monitoring substrate W disposed in the CNT zone. The substrate Ws4 is a monitoring substrate W disposed in the B-C zone. The substrate Ws5 is a monitoring substrate W disposed in the BTM zone.

Figure 2B:
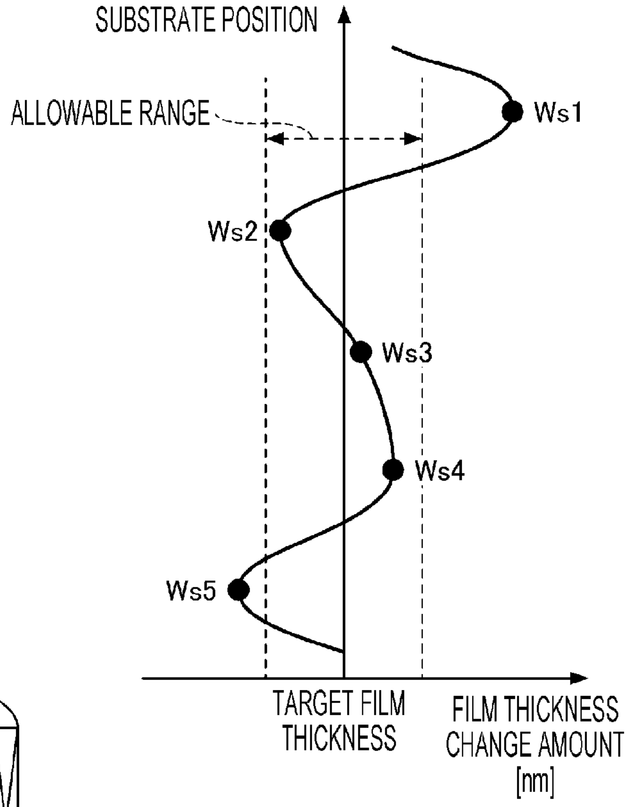
FIG. 2B is a graph illustrating a deviation of film thickness of a model substrate with respect to a target film thickness.

As illustrated in, for example, FIG. 2B, a significant deviation occurs in the film thickness of the substrate Ws1 disposed in the TOP or the film thickness of the substrate Ws5 disposed in the BTM, among the monitoring substrates Ws1 to Ws5. It is considered that the film thickness deviation in the substrate Ws1 is partly due to the influence of the ceiling heater 52*b*, and the film thickness deviation in the substrate Ws5 is partly due to the influence of the lower heater 20. For example, when the substrates W are carried into the region where the significant film thickness deviation occurs, the substrates W may be wasted because the inter-plane uniformity may not be achieved in a portion of the substrates W.

When the temperature of the ceiling heater 52*b* or the temperature of the lower heater 20 is simply regulated, the temperature of the entire processing container 10 (the respective substrates W) may also be affected. Therefore, the substrate processing apparatus 1 makes a model of a film thickness distribution variation considering the temperature change of the ceiling heater 52*b* and/or the temperature change of the lower heater 20, to predict the film thickness during the substrate processing and set a process region of each substrate W.

First Embodiment

Figure 3:
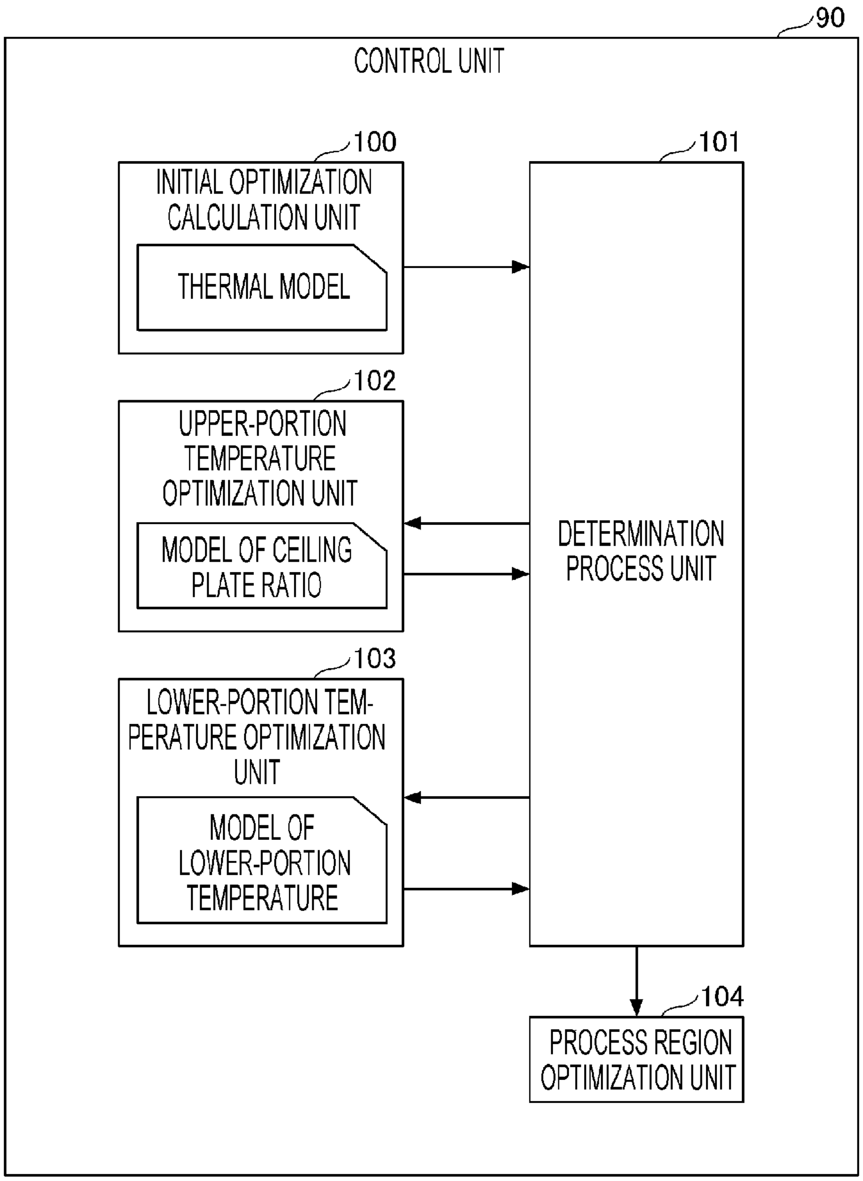
FIG. 3 is a block diagram illustrating functional blocks of a control unit according to a first embodiment.

Specifically, as illustrated in FIG. 3, the control unit 90 according to a first embodiment organizes an initial optimization calculation unit 100, a determination process unit 101, an upper-portion temperature optimization unit 102, a lower-portion temperature optimization unit 103, and a process region optimization unit 104, in a temperature regulation method for performing the substrate processing.

The initial optimization calculation unit 100 calculates initial temperature conditions by performing an inter-plane uniformity regulation to achieve the film thickness uniformity among the individual substrates W in the respective zones and an in-plane uniformity regulation to achieve the film thickness uniformity within the plane of each substrate W. That is, the initial optimization calculation unit 100 is a functional block that calculates temperature conditions for optimizing the temperature of each substrate W at the beginning of the temperature regulation method.

The initial optimization calculation unit 100 retains information on the temperature ratio of each zone that is set in advance through, for example, experiments or simulations, and calculates a relative temperature condition of each zone to a target temperature when the target temperature is extracted from a recipe of the substrate processing, in the inter-plane uniformity regulation. For example, the control unit 90 regulates the temperature of each zone to shift in the range of about 0° C. to about ±5° C. relative to the target temperature of the recipe. Accordingly, the temperature of each zone is regulated to vary during the substrate processing, so that the film thickness uniformity of a film being formed on the individual substrates W is implemented.

Figure 4:
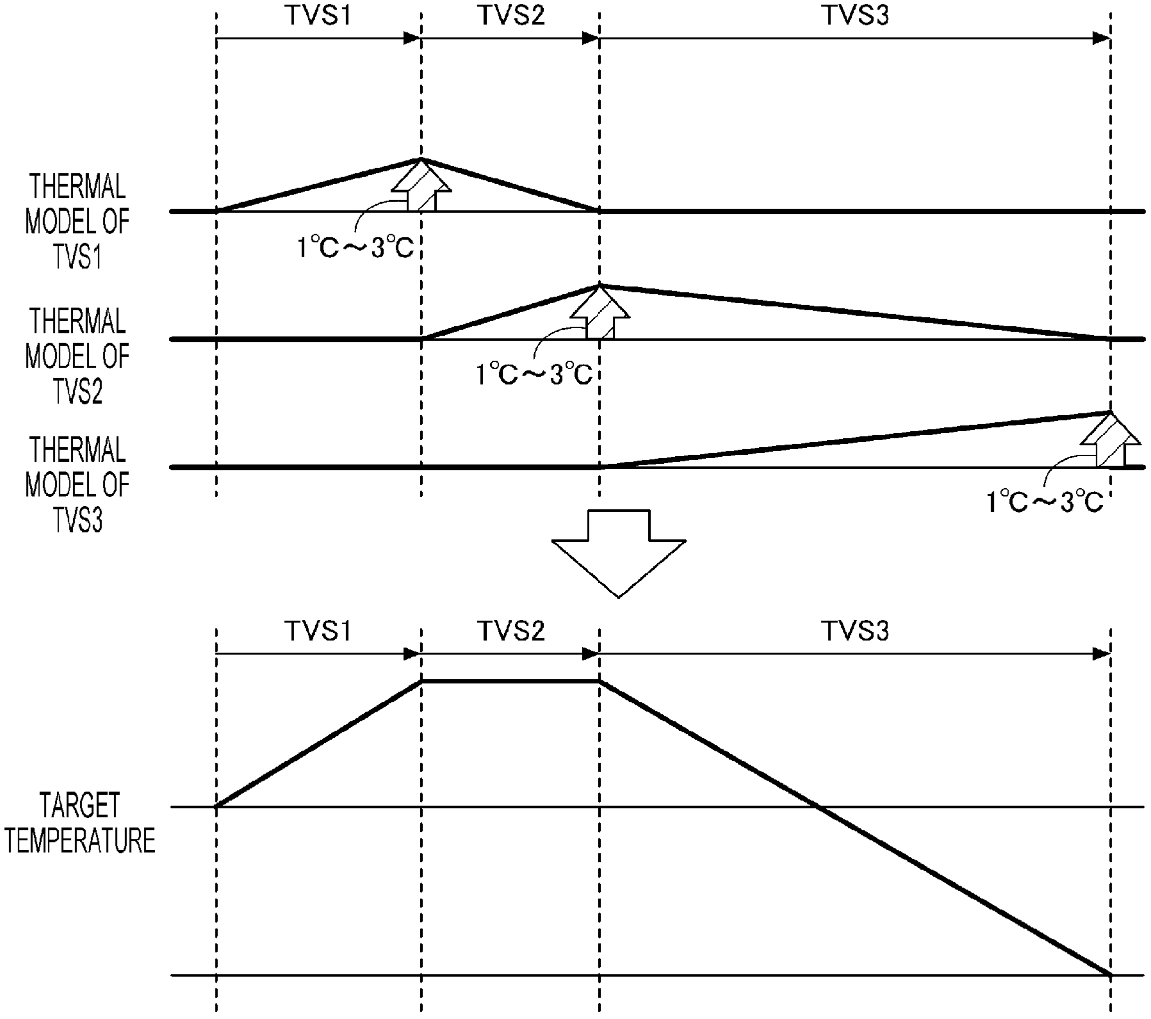
FIG. 4 is a view illustrating the calculation of temperature conditions by an inter-plane uniformity regulation and an in-plane uniformity regulation when thermal models are used.

Further, in the in-plane uniformity regulation, the initial optimization calculation unit 100 sets a plurality of steps for changing the temperature during the substrate processing, to regulate an in-plane temperature distribution of each substrate W. For example, the initial optimization calculation unit 100 sets a temperature changing process TVS1 to raise (or lower) the temperature to a set temperature of a film formation preparation step, a standby process TVS2 to maintain the temperature at the set temperature for a predetermined time period, and a film formation process TVS3 to supply a processing gas while lowering (or raising) the temperature during a film formation. As illustrated in FIG. 4, temperature conditions of TVS1 to TVS3 are set individually as parameters such as the set temperature of each zone of TVS1, the set temperature of each zone of TVS2, the set temperature of each zone of TVS3, and the time periods of TVS1, TVS2, and TVS3.

The temperature conditions of TVS1 to TVS3 are calculated by an optimization calculation using target temperatures set by a user in a recipe and thermal models. The thermal models of the in-plane uniformity regulation are generated as a thermal model of TVS1, a thermal model of TVS2, and a thermal model of TVS3, for each of the plurality of zones. Each thermal model is obtained by simulating a temperature of TVS3 changing relative to the target temperature (the lower figure of FIG. 4) when the set temperature in each process of TVS1 to TVS3 is changed in the range of 1° C. to 3° C. (the upper figure of FIG. 4). The lower figure of FIG. 4 is a graph illustrating the temperature change amounts of TVS1 to TVS3 in a predetermined zone among the zones of TOP to BTM.

Each thermal model is generated as map information (table), in which the set temperatures of each of the plurality of zones and the temperature change amount of the substrates W are associated with each other by conducting, for example, experiments or simulations during the manufacture of the substrate processing apparatus 1, and is stored in the memory 92. Specifically, the thermal model of TVS1 is generated by examining the change amount of the average temperature of TVS3 when the set temperature of TVS1 is changed in the range of 1° C. to 3° C. (relative to the unit temperature change amount of TVS1). Similarly, the thermal model of TVS2 is generated by examining the change amount of the average temperature of TVS3 when the temperature of TVS2 is changed in the range of 1° C. to 3° C. (relative to the unit temperature change amount of TVS2). The thermal model of TVS3 is generated by examining the change amount of the average temperature of TVS3 (relative to the unit temperature change amount of TVS3) when the temperature of TVS3 is changed in the range of 1° C. to 3° C.). By calculating the set temperatures and the time periods of TVS1 to TVS3 of each zone based on the thermal models, the control unit 90 may achieve the film thickness uniformity of the film formed on each substrate W.

Then, the control unit 90 performs the substrate processing based on the temperature conditions of each zone that have been calculated by the initial optimization calculation unit 100. Thereafter, the user measures the film thickness of the individual substrates W (model substrates Ws1 to Ws5) in the respective zones, and inputs the actual measured film thickness to the control unit 90. The control unit 90 may be configured to simulate the substrate processing based on the calculated temperature conditions and predict the film thickness of the substrates W of each zone.

When the actual measured film thickness of the substrates W of each zone is received from the initial optimization calculation unit 100, the determination process unit 101 compares a target film thickness of the substrates W and the actual measured film thickness of each zone, to monitor a film thickness deviation (film thickness change amount). Then, when the actual measured film thickness of, for example, the TOP zone deviates from the target film thickness by a predetermined allowable range or more (see also, e.g., FIG. 2B), the determination process unit 101 determines that there is a need to optimize the temperature of each substrate W of the TOP zone. With this determination, the determination process unit 101 commands the upper-portion temperature optimization unit 102 to perform a temperature optimizing process. Further, when the actual measured film thickness of, for example, the BTM zone deviates from the target film thickness by the predetermined allowable range or more, the determination process unit 101 determines that there is a need to optimize the temperature of each substrate W of the BTM zone. With this determination, the determination process unit 101 commands the lower-portion temperature optimization unit 103 to perform the temperature optimizing process.

The upper-portion temperature optimization unit 102 operates based on the command for optimizing the upper-portion temperature, to perform an optimization calculation. In the present embodiment, the upper-portion temperature optimization unit 102 calculates the ratio of the power fed to the ceiling heater 52*b* with respect to the power fed to the side heater 52*a* of the TOP zone (ceiling plate ratio), and calculates the optimization of the ceiling plate ratio. As described above, this is because the control unit 90 controls the powers fed to the side heater 52*a* of the TOP zone and the ceiling heater 52*b* based on the ceiling plate ratio when heating the substrates W. Further, the side heater 52*a* of the TOP zone and the ceiling heater 52*b* largely affect the inter-plane uniformity among the individual substrates W of the upper side.

Specifically, the upper-portion temperature optimization unit 102 calculates the optimization of the ceiling plate ratio by using an evaluation function J illustrated in FIG. 5A. Among the multiple parameters of the right-hand side for calculating the evaluation function J, a residual from the target film thickness, a model, and a fine-tuning coefficient are parameters, which are determined prior to the calculation. Meanwhile, an adjustment knob change amount is a variable parameter in the calculation of the evaluation function J. In the calculation of the optimization of the ceiling plate ratio, a quadratic programming method is used to calculate the adjustment knob change amount that minimizes the evaluation function J.

Of the parameters of the evaluation function J, the "residual from the target film thickness" refers to a difference between the actual measured film thickness calculated in the initial optimization calculation unit 100 and the target film thickness. For the residual from the target film thickness, the actual measured film thickness of each of the TOP, T-C, CNT, T-B, and BTM zones may be used, or only the actual measured film thickness of the TOP zone may be used. Further, of the parameters of the evaluation function J, the "fine-tuning coefficient" refers to a determination coefficient that does not vary with respect to the parameter of the variable adjustment knob change amount.

Of the parameters of the evaluation function J, the "model" refers to a model set in advance by conducting, for example, experiments or simulations in order to calculate the optimization of the ceiling plate ratio. The model of the ceiling plate ratio is an upper-portion temperature model indicating the relationship of a film thickness change amount (or a temperature change amount) of each substrate W when the ceiling plate ratio is changed. From the model, a zone where the film thickness deviation occurs and the degree of the deviation may be identified. For example, as illustrated in FIG. 5B, the model of the ceiling plate ratio is stored in the memory 92 as map information indicating the film thickness change amount of the substrates W of each zone when the ceiling plate ratio is changed by 0.1 times.

The upper-portion temperature optimization unit 102 solves the evaluation function J by the appropriate algorithm of the quadratic programming method using the parameters set in advance as described above. As a result, the adjustment knob change amount that minimizes the evaluation function J may be determined. The obtained adjustment knob change amount indicates a value (temperature condition) at which the difference in temperature (or film thickness) among the substrates W of the respective zones is the smallest when the ceiling plate ratio is changed. Accordingly, from the obtained adjustment knob change amount, the upper-portion temperature optimization unit 102 may further calculate a predicted film thickness based on the optimized ceiling plate ratio. The calculation of the predicted film thickness may be performed, for example, by using a process model, stored in advance, indicating the relationship between the temperature of the substrates W and the film thickness or by performing simulations based on the temperature conditions.

The lower-portion temperature optimization unit 103 also operates based on the command for optimizing the lower-portion temperature, to perform the optimization calculation in the similar manner to the upper-portion temperature optimization unit 102. At this time, the lower-portion temperature optimization unit 103 does not calculate the ratio of the power of the lower heater 20 to the power of the side heater 52*a* of the BTM zone, but calculates the optimization when the temperature of the lower heater 20 itself (lower-portion temperature) is changed. Thus, the control unit 90 may control the temperature of the lower heater 20, independently from the side heater 52*a* of the BTM zone.

The lower-portion temperature optimization unit 103 calculates the optimization of the lower-portion temperature by using the evaluation function J illustrated in FIG. 5A. For the "residual from the target film thickness" among the parameters of the evaluation function J, when the predicted film thickness is calculated previously by performing the calculation of the upper-portion temperature optimization unit 102, the difference between the predicted film thickness and the target film thickness is used. Alternatively, for the residual from the target film thickness, the difference between the predicted film thickness calculated by the initial optimization calculation unit 100 and the target film thickness may be used. This is because the temperature of each substrate W of the BTM zone is hardly affected by the heating of the side heater 52*a* of the TOP zone or the ceiling heater 52*b*.

Of the parameters of the evaluation function J, the "model" is a lower-portion temperature model indicating the relationship of the film thickness distribution (or temperature distribution) of the substrates W when the temperature of the lower heater 20 is changed. For example, as illustrated in FIG. 5C, the lower-portion temperature model is stored in the memory 92 as map information indicating the film thickness change amount of the substrates W of each zone when the lower-portion temperature is changed by 1° C. Further, when generating the lower-portion temperature model, only the temperature of the lower portion may be changed to measure the film thickness change amount of the substrates W of each zone, and when generating the ceiling plate ratio model, only the ceiling plate ratio may be changed to measure the film thickness change amount of each substrate W. Meanwhile, since the ceiling plate ratio and the lower-portion temperature regulate the temperatures of the regions away from each other, the ceiling plate ratio and the lower-portion temperature may be swapped during a single substrate processing to measure the film thickness change amount.

The lower-portion temperature optimization unit 103 solves the evaluation function J by the appropriate algorithm of the quadratic programming method using the parameters described above, so as to determine the adjustment knob change amount that minimizes the evaluation function J. The adjustment knob change amount indicates a value (temperature condition) at which the difference in temperature (or film thickness) among the substrates W of the respective zones is the smallest when the lower-portion temperature is changed. From the obtained adjustment knob change amount, the lower-portion temperature optimization unit 103 may further calculate the predicted film thickness based on the optimized lower-portion temperature.

Referring back to FIG. 3, the determination process unit 101 compares the predicted film thickness of the substrates W of each zone calculated in the upper-portion temperature optimization unit 102 when the temperature optimization is performed in the upper-portion temperature optimization unit 102, with the target film thickness of the substrates W. Similarly, the determination process unit 101 compares the predicted film thickness of the substrates W of each zone calculated in the lower-portion temperature optimization unit 103 when the temperature optimization is performed in the lower-portion temperature optimization unit 103, with the target film thickness of the substrates W. Then, when the predicted film thickness of the optimized ceiling plate ratio deviates from the target film thickness by the predetermined allowable range or more, and/or when the predicted film thickness of the optimized lower-portion temperature deviates from the target film thickness by the predetermined allowable range or more, the determination process unit 101 determines that there is a need to change the process region of the substrate processing. With this determination, the determination process unit 101 outputs a region optimization command for optimizing the process region of the substrate processing, to the process region optimization unit 104.

The region optimization command includes the predicted film thickness of each zone that is calculated lately by the upper-portion temperature optimization unit 102 or the lower-portion temperature optimization unit 103. For example, in the optimization process, when the ceiling plate ratio is optimized after optimizing the lower-portion temperature, the region optimization command includes the predicted film thickness of each zone of the case where the ceiling plate ratio is optimized.

Based on the region optimization command, the process region optimization unit 104 performs a process of resetting the zones used for the substrate processing. The optimization of the process region may be performed by linearly interpolating the film thickness change amount using the predicted film thicknesses of the optimized aspect ratio and lower-portion temperature, the model of the ceiling plate ratio, and the model of the lower-portion temperature, thereby calculating the film thickness change amount of the individual substrates W arranged vertically in a row (also see, e.g., FIG. 2B).

Then, the process region optimization unit 104 sets the region where the film thickness change amount of each substrate W deviates by the allowable range or more, as a region where no substrate processing is performed. For example, when one or multiple substrates W from the uppermost of the individual substrates W of the TOP zone have a large film thickness change amount, the process region optimization unit 104 determines to perform the substrate processing while omitting the corresponding substrates W. Further, when one or multiple substrates W from the lowermost of the individual substrates W of the BTM zone have a large film thickness change amount, the process region optimization unit 104 determines to perform the substrate processing while omitting the corresponding substrates W.

Through this process, the control unit 90 may perform the temperature regulation including the ceiling plate ratio and the lower-portion temperature. Further, when there is a substrate W having a large film thickness deviation even after the optimization is performed, the control unit 90 may set the region of the corresponding substrate W not to be used for the substrate processing, and notifies this information to the user. As a result, before performing the substrate processing, the user may recognize the range that is not used for the substrate processing, and therefore, may not dispose the substrates W in the corresponding zone. Further, the substrate processing apparatus 1 may perform the substrate processing by disposing dummy substrates in the range that is not used for the substrate processing (where the predicted film thickness deviates).

Figure 6:
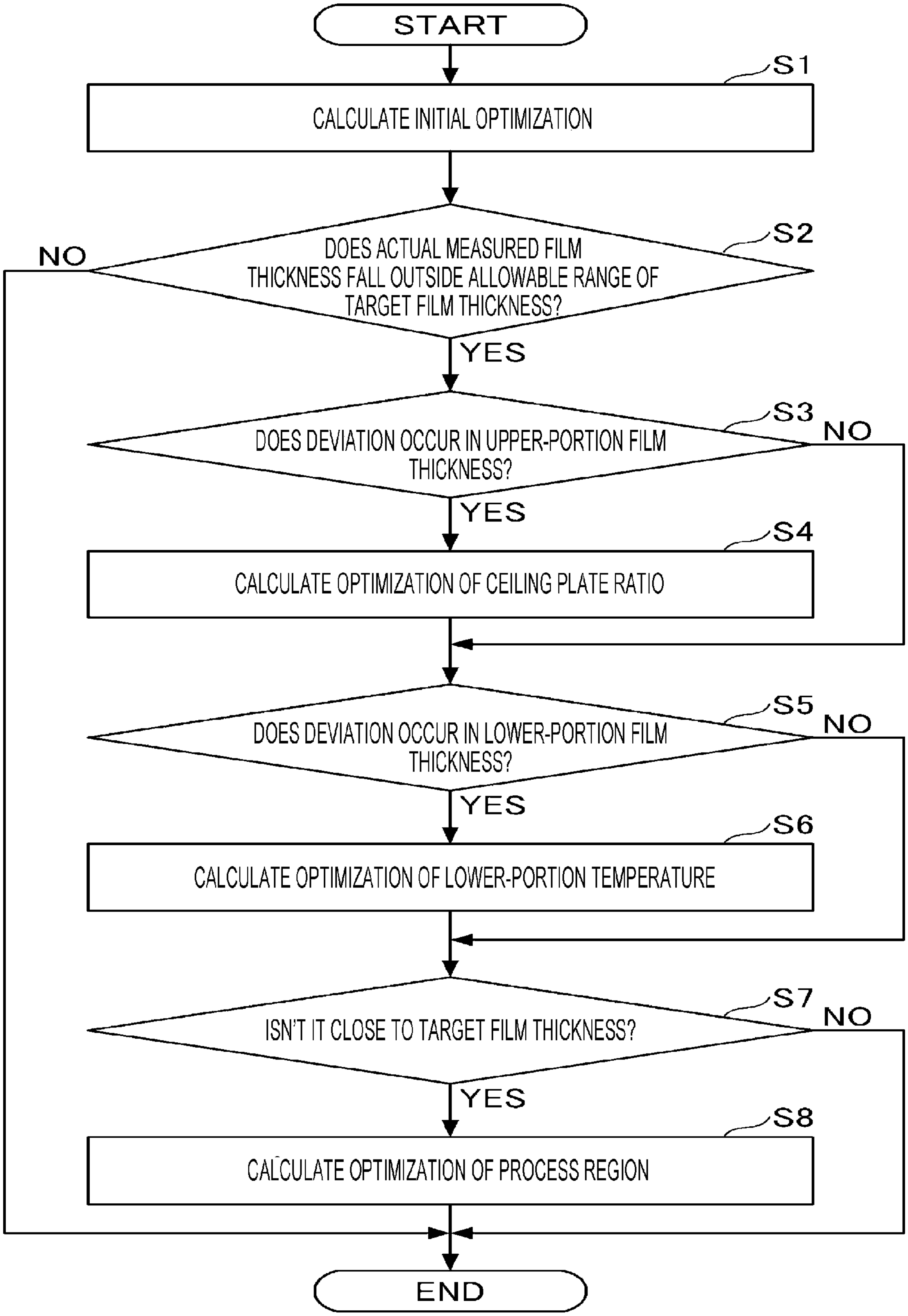
FIG. 6 is a flow chart illustrating a temperature regulation method according to the first embodiment.

The substrate processing apparatus 1 according to the present embodiment is basically configured as described above, and the process flow of the temperature regulation method will be described hereinafter with reference to FIG. 6.

In order to regulate the temperature of each substrate W during the substrate processing, the control unit 90 of the substrate processing apparatus 1 first performs the inter-plane uniformity regulation and the in-plane uniformity regulation by the initial optimization calculation unit 100 as an initial optimization calculation (step S1). As a result, the control unit 90 may obtain the relative set temperature of each zone of the processing container 10, and also obtain the temperature conditions (e.g., correction temperatures and performance time periods) of TVS1 to TVS3 of each zone. Then, the user measures the actual film thickness of the substrates W (substrates Ws1 to Ws5) of the respective zones in the substrate processing under the calculated temperature conditions, and inputs the actual measured film thickness to the control unit 90.

Next, based on the actual film thickness measured after the substrate processing and the target film thickness predetermined by, for example, a recipe, the determination process unit 101 determines whether the actual measured film thickness falls outside the allowable range of the target film thickness (step S2). When it is determined that the actual measured film thickness does not fall outside the allowable range of the target film thickness (falls within the allowable range of the target film thickness) (step S2: NO), the film thickness uniformity is achieved among the individual substrates W even though the substrate processing is performed according to the calculated temperature conditions. Thus, the determination process unit 101 terminates the current temperature regulation method. Meanwhile, when it is determined that the actual measured film thickness falls outside the allowable range of the target film thickness (step S2: YES), the film thickness deviation occurs among the individual substrates W at the case where the substrate processing is performed according to the calculated temperature conditions. Thus, the determination process unit 101 identifies a location of the cause for the film thickness deviation among the substrates W, and performs the temperature optimization of the location.

Specifically, the determination process unit 101 determines whether a deviation occurs in the film thickness of each substrate W of the TOP zone (step S3). When it is determined that a deviation occurs in the film thickness of the substrates W of the upper side (step S3: YES), the process proceeds to step S4, to perform the optimization calculation of the ceiling plate ratio by the upper-portion temperature optimization unit 102. As described above, in the calculation of the optimization of the ceiling plate ratio, the quadratic programming method is solved using the evaluation function J having the model of the ceiling plate ratio (see, e.g., FIGS. 5A and 5B), so as to acquire the adjustment knob change amount. Then, the upper-portion temperature optimization unit 102 calculates the predicted film thickness based on the acquired adjustment knob change amount. Meanwhile, when it is determined that no deviation occurs in the film thickness of the substrates W of the upper side (step S3: NO), step S4 is skipped.

Next, the determination process unit 101 determines whether a deviation occurs in the film thickness of each substrate W of the BTM zone, based on the predicted film thickness calculated by the upper-portion temperature optimization unit 102 or the predicted film thickness calculated by the initial optimization calculation unit 100 (step S5). When it is determined that a deviation occurs in the film thickness of the substrates W of the lower side (step S5: YES), the process proceeds to step S6, to perform the calculation of the optimization of the lower-portion temperature by the lower-portion temperature optimization unit 103. As described above, in the calculation of the optimization of the lower-portion temperature, the quadratic programming method is solved using the evaluation function J having the model of the lower-portion temperature (see, e.g., FIGS. 5A and 5C) so as to acquire the adjustment knob change amount. Then, the lower-portion temperature optimization unit 103 calculates the predicted film thickness based on the acquired adjustment knob change amount. Meanwhile, when it is determined that no deviation occurs in the film thickness of the substrates W of the lower side (step S5: NO), step S6 is skipped. The control unit 90 may reverse the order of steps S3 and S4 and steps S5 and S6.

Then, the determination process unit 101 compares the predicted film thickness calculated in step S6 with the target temperature, to determine whether the film thickness of each substrate W is not close to the target thickness (i.e., whether the predicted film thickness falls outside the allowable range of the target film thickness) (step S7). At this time, the predicted film thickness is obtained from the optimization of the ceiling plate ratio and/or the lower-portion temperature. Accordingly, when it is determined that the predicted film thickness of each substrate W falls within the allowable range (step S7: NO), step S8 is skipped, and the current temperature regulation method is terminated.

Meanwhile, when it is determined that the predicted film thickness of each substrate W falls outside the allowable range (step S7: YES), the process region optimization unit 104 calculates a range excluding the region where the film thickness deviation occurs, in the substrate processing (step S8). For example, as described above, the process region optimization unit 104 calculates the range of the substrates W in which the film thickness deviation occurs, by linearly interpolating the predicted film thickness when the ceiling plate ratio and/or the lower-portion temperature is optimized, and sets the substrates W of the calculated range not to be subjected to the substrate processing. Then, the control unit 90 notifies the user of the range to be subjected to the substrate processing via the user interface 95. As a result, the user may efficiently recognize the effective range for the substrate processing, and adjust the set position of each substrate W on the wafer boat 16.

As described above, according to the temperature regulation method of the present disclosure, even in the configuration with the ceiling heater 52*b* or the lower heater 20, the temperature conditions considering the heaters may easily be obtained. Thus, the substrate processing apparatus 1 may not repeat the substrate processing performed to achieve the temperature optimization, and thus, may smoothly start the substrate processing. Therefore, the substrate processing apparatus 1 achieves the process efficiency and the cost reduction. Further, the substrate processing apparatus 1 identifies the region where the film thickness deviation occurs during the substrate processing, to prevent the substrates from being carried into the region, so that the yield rate of the substrate processing may be significantly improved.

The substrate processing apparatus 1 and the temperature regulation method according to the present disclosure are not limited to the embodiments above, and various modifications may be made thereto. For example, the lower heater 20 is not limited to the heating of the manifold 17 disposed below the processing container 10, but may heat the lower portion of the processing container 10 (e.g., the lower side of the BTM zone) where the temperature may easily drop due to, for example, the gas distribution.

For example, when regulating the temperature of the upper portion of the processing container 10, the control unit 90 calculates the ceiling plate ratio, which is the ratio between the power of the side heater 52*a* of the TOP zone and the power of the ceiling heater 52*b*, and performs a control based on the ceiling plate ratio. However, the control unit 90 may independently control the temperature of the side heater 52*a* of the TOP zone and the temperature of the ceiling heater 52*b*. In this case, in the calculation for optimizing the upper portion of the processing container 10, the control unit 90 may use the model indicating the film thickness change amount when the temperature of the ceiling heater 52*b* is changed.

In the embodiments described above, the substrate processing apparatus 1 is configured to include both the ceiling heater 52*b* and the lower heater 20. However, the substrate processing apparatus 1 may be configured to include either one of the ceiling heater 52*b* and the lower heater 20. In this case, the control unit 90 may perform either one of the optimization calculation of the ceiling plate ratio and the optimization calculation of the lower-portion temperature, depending on the heater (the ceiling heater 52*b* or the lower heater 20) included in the apparatus. Then, after performing either one of the optimization calculation of the ceiling plate ratio and the optimization calculation of the lower-portion temperature, the control unit 90 proceeds to the process of optimizing the process region by the process region optimization unit 104. In this case as well, the substrate processing apparatus 1 may efficiently regulate the temperature conditions of the substrate processing with reduced costs.

Second Embodiment

Figure 7B:
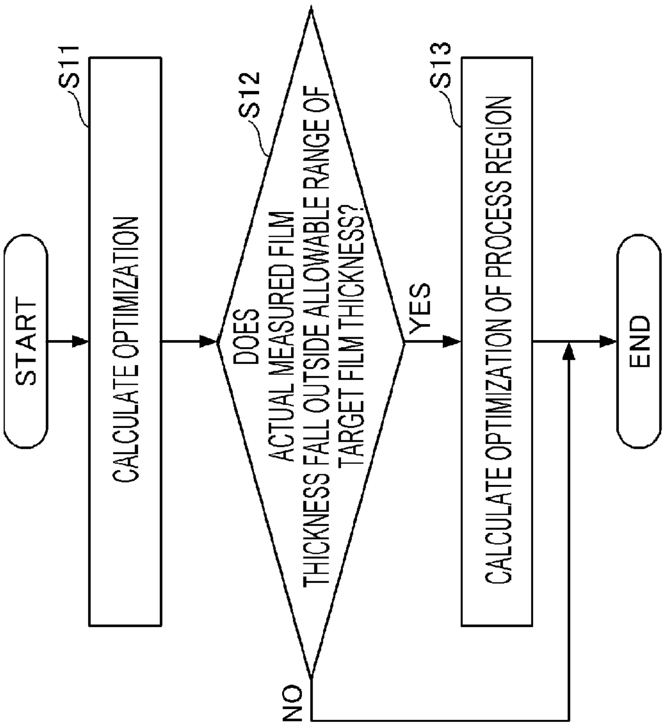
FIG. 7B is a flow chart illustrating a temperature regulation method according to the second embodiment.
Figure 7A:
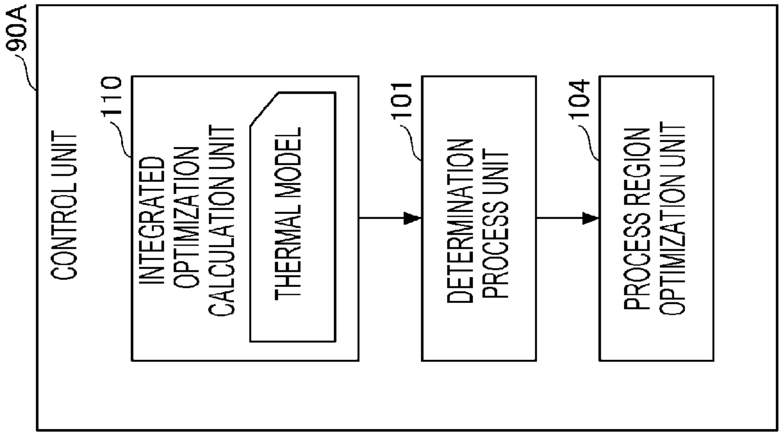
FIG. 7A is a block diagram illustrating function blocks of a control unit according to a second embodiment.

Next, a substrate processing apparatus 1 (a control unit 90A) and a temperature regulation method according to a second embodiment will be described with reference to FIGS. 7A, 7B, and 8. As illustrated in FIG. 7A, the control unit 90A of the substrate processing apparatus 1 organizes therein an integrated optimization calculation unit 110, a determination process unit 101, and a process region optimization unit 104. Then, the integrated optimization calculation unit 110 performs calculations considering the ceiling plate ratio and/or the lower-portion temperature in advance, in the calculation of the inter-plane uniformity regulation and the in-plane uniformity regulation.

Specifically, the substrate processing apparatus 1 generates a thermal model of a change in each parameter of TVS3 (e.g., the temperature and the power) caused by sequentially changing the temperatures of the zones from TOP to BTM by a certain amount. Further, as illustrated in FIG. 8, the substrate processing apparatus 1 generates a model of temperature conditions by adding, to the thermal model, the model of the ceiling plate ratio (upper-portion temperature model) and the model of the lower-portion temperature (lower-portion temperature model) as parameters that change the temperature. That is, the model of temperature conditions is a model considering the set temperatures of the zones from TOP to BTM, the ceiling plate ratio, and the lower-portion temperature.

For example, the model of temperature conditions is stored in the memory 92 as map information describing the film thickness change amount of each zone when TVS1 to TVS3 are each changed by 1° C., for each of a plurality of slots. Further, in the map information, the film thickness change amount when the ceiling plate ratio is increased by 0.1 times is described for each of the plurality of slots, and the film thickness change amount when the lower-portion temperature is raised by 1° C. is described for each of the plurality of slots.

By using the model of temperature conditions, the integrated optimization calculation unit 110 calculates the optimum temperature conditions (e.g., the set temperatures, the ceiling plate ratio, and the lower-portion temperature) of the zones from TOP to BTM, through the quadratic programming method. In this case, when the model of the ceiling plate ratio, the thermal models of TVS1 to TVS3, and the model of the lower-portion temperature are set as m1, m2, and m3, respectively, the integrated optimization calculation unit 110 may represent the table of FIG. 8 as row parameters on a matrix. Then, by setting the ceiling plate ratio, the temperature conditions, and the lower-portion temperature change amount as column parameters u1, u2, and u3, (adjustment knob change amount), respectively, on the matrix, the evaluation function J (see, e.g., FIG. 5A) may be used as in the first embodiment. That is, the integrated optimization calculation unit 110 may solve the quadratic programming method to obtain u1, u2, and u3 that minimize the evaluation function J.

Further, the integrated optimization calculation unit 110 acquires the actual measured film thickness when the substrate processing is performed based on the calculated adjustment knob change amount (temperature conditions). The film thickness to be acquired may be the predicted film thickness of each substrate W that is predicted by performing a simulation based on the calculated adjustment knob change amount. When the predicted film thickness of the TOP side and/or the predicted film thickness of the BTM side deviates from the target film thickness (falls outside the allowable range), the determination process unit 101 determines the optimization of the process region by the process region optimization unit 104. Since the process region optimizing process is the same as in the first embodiment, descriptions thereof are omitted.

The control unit 90A according to the second embodiment is basically configured as described above, and the temperature regulation method will be described hereinafter. As illustrated in FIG. 7B, in the temperature regulation method, the control unit 90A first performs the optimization calculation considering the ceiling plate ratio and the lower-portion temperature by the integrated optimization calculation unit 110 (step S11). As a result, from the beginning, the integrated optimization calculation unit 110 may obtain the adjustment knob change amount that optimizes the ceiling plate ratio and the lower-portion temperature, and calculate the predicted film thickness of the substrate processing based on the adjustment knob change amount.

Then, the determination process unit 101 compares the predicted film thickness calculated by the integrated optimization calculation unit 110 with the target film thickness, to determine whether the predicted film thickness of each substrate W falls outside the allowable range of the target film thickness (step S12). When it is determined that the predicted film thickness of each substrate W falls within the allowable range of the target film thickness (step S12: NO), it is regarded that the film thickness uniformity is achieved in the individual substrates W arranged vertically in a row, so that step S13 is skipped, and the current temperature regulation method is terminated.

Meanwhile, when it is determined that the predicted film thickness of each substrate W falls outside the allowable range of the target film thickness (step S12: YES), the process region optimization unit 104 calculates a range excluding the region where the film thickness deviation occurs, in the substrate processing (step S13). Then, the control unit 90 notifies the user of the range to be subjected to the substrate processing, via the user interface 95. As a result, in the temperature regulation method of the second embodiment as well, the user may efficiently recognize the effective range for the substrate processing, and may adjust the set position of each substrate W on the wafer boat 16.

In this way, the substrate processing apparatus 1 and the temperature regulation method of the second embodiment implement the optimization of the ceiling plate ratio and the lower-portion temperature, along with the inter-plane uniformity regulation and the in-plane uniformity regulation. In particular, the control unit 90 may monitor the film thickness of each substrate W by inputting the actual measured film thickness, so that the temperature conditions of the ceiling heater 52*b* and/or the lower heater 20 may be more accurately calculated. Further, when a deviation occurs in the film thickness of each substrate W, the optimization of the process region may be efficiently performed.

The technical ideal and effects of the present disclosure described in the embodiments above are described below.

A first aspect of the present disclosure provides a substrate processing apparatus 1 including: a processing container 10 that performs a substrate processing for forming a film on a plurality of substrates W; a temperature adjustment unit 50 that adjusts a temperature of the plurality of substrates W accommodated in the processing container 10, for each of a plurality of zones set in advance; and a control unit 90 that controls an operation of the temperature adjustment unit 50. The temperature adjustment unit 50 includes at least one of a ceiling heater 52*b* that heats the processing container 10 from a ceiling and a lower heater 20 that heats a lower portion of the processing container 10 or a portion below the processing container 10. The control unit 90 holds at least one of an upper-portion temperature model of a film thickness change amount based on a temperature change of the ceiling heater 52*b* and a lower-portion temperature model of a film thickness change amount based on a temperature change of the lower heater 20, in association with the ceiling heater 52*b* and the lower heater 20 of the temperature adjustment unit 50, calculates a temperature condition for each of the plurality of zones to uniformize a film thickness among the plurality of substrates during the substrate processing, by using the upper-portion temperature model and/or the lower-portion temperature model, acquires the film thickness of the plurality of substrates W when the substrate processing is performed under the calculated temperature condition, and compares the acquired film thickness with a target film thickness, and when the acquired film thickness falls outside an allowable range of the target film thickness, sets a process region to be applied to the substrate processing on the plurality of substrates W, based on the comparison.

Accordingly, the substrate processing apparatus 1 may efficiently set temperatures for achieving the inter-plane uniformity of the film thickness among the plurality of substrates W, when setting the temperature conditions for the substrate processing. Especially, even when a large deviation occurs in the film thickness during the substrate processing under the calculated temperature conditions, the substrate processing apparatus 1 may set the region where the deviation occurs, as a process region to be omitted from the substrate processing, so that the waste of the substrates W may be eliminated.

The control unit 90 calculates an initial temperature condition for each of the plurality of zones based on a thermal model held in advance, and when the acquired film thickness deviates from the target film thickness based on the initial temperature condition, optimizes the temperature condition by using the held upper-portion temperature model and/or lower-portion temperature model. As a result, the substrate processing apparatus 1 may successfully optimize only the temperature of a required location (upper-portion or lower-portion temperature) among the plurality of substrates W.

In optimizing the temperature condition, the control unit 90 calculates an adjustment knob change amount that minimizes an evaluation function having the upper-portion temperature model and/or the lower-portion temperature model, a residual between the acquired film thickness and the target film thickness, a fine-tuning coefficient, and the adjustment knob change amount. As a result, the control unit 90 may successfully calculate the temperature conditions when the upper-portion temperature model and/or the lower-portion temperature model is used.

The control unit 90 calculates a predicted film thickness of the plurality of substrates W based on the calculated adjustment knob change amount, and compares the predicted film thickness with the target film thickness to determine whether the predicted film thickness falls outside the allowable range of the target film thickness. As a result, the control unit 90 may easily determine whether the film thickness deviation has been resolved, when the optimization is performed considering the ceiling heater 52*b* and the lower heater 20.

The control unit 90 holds in advance a model of a temperature condition obtained by adding the upper-portion temperature model and/or the lower-portion temperature model to a thermal model for regulating a temperature of each of the plurality of zones, and optimizes the temperature condition for each of the plurality of zones based on the model of the temperature condition. By using the model of the temperature condition, the control unit 90 may more quickly optimize the temperature conditions for each of the plurality of zones.

In optimizing the temperature condition, the control unit 90 calculates an adjustment knob change amount that minimizes an evaluation function having the model of the temperature condition, a residual between the acquired film thickness and the target film thickness, a fine-tuning coefficient, and the adjustment knob change amount. As a result, the control unit 90 may successfully calculate the temperature conditions even in the model of the temperature condition including the upper-portion temperature model and/or the lower-portion temperature model.

In setting the process region, the control unit 90 extracts a substrate existing outside the allowable range of the target film thickness, by performing a linear interpolation based on the acquired film thickness. As a result, the control unit 90 may accurately set the range of substrates W that will not be subjected to the substrate processing, among the plurality of substrates W.

The control unit 90 controls a temperature of the ceiling heater 52*b* based on a ceiling plate ratio, which is a ratio between a power fed to a side heater 52*a* heating a zone closest to the ceiling heater 52*b* among the plurality of zones and a power fed to the ceiling heater 52*b*, and the upper-portion temperature model is information representing the film thickness change amount when the ceiling plate ratio is changed. As a result, the substrate processing apparatus 1 may more accurately perform the optimization of the temperature of the ceiling heater 52*b*.

A second aspect of the present disclosure provides a temperature regulation method of a substrate processing apparatus 1 including a processing container 10 that performs a substrate processing for forming a film on a plurality of substrates W, and a temperature adjustment unit 50 that adjusts a temperature of the plurality of substrates W accommodated in the processing container 10, for each of a plurality of zones set in advance. The temperature adjustment unit 50 includes at least one of a ceiling heater 52*b* that heats the processing container 10 from a ceiling and a lower heater 20 that heats a lower portion of the processing container 10 or a portion below the processing container 10. The temperature regulation method includes: calculating a temperature condition for each of the plurality of zones to uniformize a film thickness among the plurality of substrates W during the substrate processing, by using at least one of an upper-portion temperature model of a film thickness change amount based on a temperature change of the ceiling heater 52*b* and a lower-portion temperature model of a film thickness change amount based on a temperature change of the lower heater 20, in association with the ceiling heater 52*b* and the lower heater 20 of the temperature adjustment unit 50; acquiring the film thickness of the plurality of substrates W when the substrate processing is performed under the temperature condition calculated in the calculating, and compares the film thickness acquired in the acquiring with a target film thickness; and when the film thickness acquired in the acquiring falls outside an allowable range of the target film thickness, sets a process region to be applied to the substrate processing on the plurality of substrates W, based on the comparing. In this case as well, the temperature regulation method may efficiently set the temperatures for achieving the inter-plane uniformity of the film thickness among the plurality of substrates W.

According to an aspect of the present disclosure, it is possible to efficiently set temperatures for achieving the inter-plane uniformity of the film thickness among a plurality of substrates.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:

a processing container configured to perform a substrate processing for forming a film on a plurality of substrates;

a temperature controller configured to adjust a temperature of the plurality of substrates accommodated in the processing container, for each of a plurality of zones set in advance; and a controller coupled to a memory and configured to control an operation of the temperature controller, wherein the temperature controller includes at least one of a ceiling heater configured to heat the processing container from a ceiling and a lower heater configured to heat a lower portion of the processing container or a portion below the processing container, the controller is configured to:

store, in the memory, at least one of an upper-portion temperature model of a film thickness change amount based on a temperature change of the ceiling heater and a lower-portion temperature model of a film thickness change amount based on a temperature change of the lower heater, in association with the ceiling heater and the lower heater of the temperature controller;

calculate a temperature condition for each of the plurality of zones to uniformize a film thickness among the plurality of substrates during the substrate processing, by using the upper-portion temperature model and/or the lower-portion temperature model;

acquire the film thickness of each of the plurality of substrates when the substrate processing is performed under the calculated temperature condition, and compares the acquired film thickness with a target film thickness;

when the acquired film thickness falls outside an allowable range of the target film thickness, set a process region in which the substrate processing is to be performed on the plurality of substrates, based on a comparison between the acquired film thickness and the target film thickness, the process region excluding a region in which a deviation of the film thickness from the target film thickness exceeds a predetermined range; and perform the substrate processing on the plurality of substrates within the process region.

2. The substrate processing apparatus according to claim 1, wherein the controller calculates an initial temperature condition for each of the plurality of zones based on a thermal model stored in the memory, and when the acquired film thickness deviates from the target film thickness based on the initial temperature condition, the controller optimizes the temperature condition by using the held upper-portion temperature model and/or lower-portion temperature model.

3. The substrate processing apparatus according to claim 2, wherein in optimizing the temperature condition, the controller calculates an adjustment knob change amount that minimizes an evaluation function having the upper-portion temperature model and/or the lower-portion temperature model, a residual between the acquired film thickness and the target film thickness, a tuning coefficient, and the adjustment knob change amount.

4. The substrate processing apparatus according to claim 3, wherein the controller calculates a predicted film thickness of the plurality of substrates based on the calculated adjustment knob change amount, and compares the predicted film thickness with the target film thickness, thereby determining whether the predicted film thickness falls outside the allowable range of the target film thickness.

5. The substrate processing apparatus according to claim 1, wherein the controller stores, in the memory, a model of a temperature condition obtained by adding the upper-portion temperature model and/or the lower-portion temperature model to a thermal model for regulating a temperature of each of the plurality of zones, and the controller optimizes the temperature condition for each of the plurality of zones based on the model of the temperature condition.

6. The substrate processing apparatus according to claim 5, wherein in optimizing the temperature condition, the controller calculates an adjustment knob change amount that minimizes an evaluation function having the model of the temperature condition, a residual between the acquired film thickness and the target film thickness, a tuning coefficient, and the adjustment knob change amount.

7. The substrate processing apparatus according to claim 1, wherein in setting the process region, the controller extracts a substrate existing outside the allowable range of the target film thickness, by performing a linear interpolation based on the acquired film thickness.

8. The substrate processing apparatus according to claim 1, wherein the controller controls a temperature of the ceiling heater based on a ceiling plate ratio, which is a ratio between a power fed to a side heater heating a zone closest to the ceiling heater among the plurality of zones and a power fed to the ceiling heater, and the upper-portion temperature model is information representing the film thickness change amount when the ceiling plate ratio is changed.

9. A temperature regulation method comprising:

providing a substrate processing apparatus including:

a processing container configured to perform a substrate processing for forming a film on a plurality of substrates;

a temperature controller configured to adjust a temperature of the plurality of substrates accommodated in the processing container, for each of a plurality of zones set in advance, the temperature controller including at least one of a ceiling heater configured to heat the processing container from a ceiling and a lower heater configured to heat a lower portion of the processing container or a portion below the processing container; and a controller coupled to a memory and configured to control an operation of the temperature controller, calculating, by the controller, a temperature condition for each of the plurality of zones to uniformize a film thickness among the plurality of substrates during the substrate processing, by using at least one of an upper-portion temperature model of a film thickness change amount based on a temperature change of the ceiling heater and a lower-portion temperature model of a film thickness change amount based on a temperature change of the lower heater, in association with the ceiling heater and the lower heater of the temperature controller;

acquiring, by the controller, the film thickness of each of the plurality of substrates when the substrate processing is performed under the temperature condition calculated in the calculating, and comparing the film thickness acquired in the acquiring with a target film thickness;

when the film thickness acquired in the acquiring falls outside an allowable range of the target film thickness, setting, by the controller, a process region in which the substrate processing is to be performed on the plurality of substrates, based on a comparing between the acquired film thickness and the target film thickness, the process region excluding a region in which a deviation of the film thickness from the target film thickness exceeds a predetermined range; and performing, by the controller, the substrate processing on the plurality of substrates within the process region.

10. A substrate processing apparatus comprising:

a processing container configured to perform a substrate processing for forming a film on a plurality of substrates;

a temperature controller configured to adjust a temperature of the plurality of substrates accommodated in the processing container, for each of a plurality of zones set in advance; and a controller coupled to a memory and configured to control an operation of the temperature controller, wherein the temperature controller includes at least one of a ceiling heater configured to heat the processing container from a ceiling and a lower heater configured to heat a lower portion of the processing container or a portion below the processing container, the controller is configured to:

store, in the memory, at least one of an upper-portion temperature model of a film thickness change amount based on a temperature change of the ceiling heater and a lower-portion temperature model of a film thickness change amount based on a temperature change of the lower heater, in association with the ceiling heater and the lower heater of the temperature controller;

calculate a temperature condition for each of the plurality of zones to uniformize a film thickness among the plurality of substrates during the substrate processing, by using the upper-portion temperature model and/or the lower-portion temperature model;

acquire the film thickness of each of the plurality of substrates when the substrate processing is performed under the calculated temperature condition, and compares the acquired film thickness with a target film thickness;

when the acquired film thickness falls outside an allowable range of the target film thickness, set a process region in which the substrate processing is to be performed on the plurality of substrates, based on a comparison between the acquired film thickness and the target film thickness, the process region excluding a region in which a deviation of the film thickness from the target film thickness exceeds a predetermined range; and perform the substrate processing on the plurality of substrates within the process region, wherein the controller controls a temperature of the ceiling heater based on a ceiling plate ratio, which is a ratio between a power fed to a side heater heating a zone closest to the ceiling heater among the plurality of zones and a power fed to the ceiling heater, and the upper-portion temperature model is information representing the film thickness change amount when the ceiling plate ratio is changed.

11. The substrate processing apparatus according to claim 1, wherein the controller is configured to set the process region based on film thicknesses respectively acquired from a plurality of monitor substrates.

* * * * *